United States Patent
Advey et al.

(10) Patent No.: US 10,312,630 B1
(45) Date of Patent: Jun. 4, 2019

(54) DEVICE AND METHOD FOR PROTECTING A CONNECTOR ASSEMBLY

(71) Applicant: YAZAKI NORTH AMERICA, INC., Canton, MI (US)

(72) Inventors: Alexander Advey, Ypsilanti, MI (US); Kevin Shaheen Pakravan, Ann Arbor, MI (US); Jen Vun Ng, Westland, MI (US)

(73) Assignee: YAZAKI NORTH AMERICA, INC., Canton, MI (US)

( * ) Notice: Subject to any disclaimer, the term of this patent is extended or adjusted under 35 U.S.C. 154(b) by 0 days.

(21) Appl. No.: 15/864,497

(22) Filed: Jan. 8, 2018

(51) Int. Cl.
| *H01R 13/52* | (2006.01) |
| *H05K 5/06* | (2006.01) |
| *H01R 13/58* | (2006.01) |

(52) U.S. Cl.
CPC ....... *H01R 13/521* (2013.01); *H01R 13/5205* (2013.01); *H01R 13/5221* (2013.01); *H05K 5/069* (2013.01); *H01R 13/58* (2013.01); *H01R 2201/26* (2013.01); *H05K 2201/0133* (2013.01); *H05K 2203/1147* (2013.01)

(58) Field of Classification Search
CPC .............. H01R 13/521; H01R 13/5205; H01R 13/5221
USPC ...................................................... 439/282
See application file for complete search history.

(56) References Cited

U.S. PATENT DOCUMENTS

| | | | |
|---|---|---|---|
| 3,182,511 A | 5/1965 | Federn et al. | |
| 4,199,159 A | 4/1980 | Evans | |
| 4,671,586 A | 6/1987 | Debolt | |
| 4,702,710 A * | 10/1987 | Dittman | H01R 13/5205 439/125 |
| 4,895,533 A * | 1/1990 | Yagi | H01R 13/5205 439/278 |
| 5,356,312 A * | 10/1994 | Abe | H01R 13/5205 439/278 |
| 5,433,621 A * | 7/1995 | Sai | H01R 13/5205 439/275 |
| 5,562,292 A | 10/1996 | Roy et al. | |
| 5,611,706 A * | 3/1997 | Makita | H01R 13/5205 439/275 |
| 5,824,962 A * | 10/1998 | Katsuma | H01R 13/5205 174/135 |
| 5,989,704 A * | 11/1999 | Hashimoto | C08L 67/06 428/331 |
| 6,007,378 A | 12/1999 | Oeth | |
| 6,482,017 B1 * | 11/2002 | Van Doorn | H01R 13/5213 439/149 |
| 6,545,583 B1 | 4/2003 | Palmer | |
| 7,004,789 B2 | 2/2006 | Kameyama et al. | |
| 7,201,609 B2 | 4/2007 | Ishikawa | |
| 7,211,731 B2 * | 5/2007 | Nagamine | H01R 13/5205 174/74 R |
| 7,658,644 B2 * | 2/2010 | Ahn | H01R 13/5208 439/587 |

(Continued)

*Primary Examiner* — Alexander Gilman

(74) *Attorney, Agent, or Firm* — Foley & Lardner LLP

(57) ABSTRACT

A connector kit includes a housing, a wire-mounted component, and a seal. In various embodiments, the seal is configured to be coupled to the housing and the wire-mounted component. The seal includes a single unitary body, and the seal is structured to provide a seal for the wire-mounted component and a wire to protect an interior of the connector from penetration by foreign substances.

20 Claims, 6 Drawing Sheets

(56) References Cited

U.S. PATENT DOCUMENTS

| | | | |
|---|---|---|---|
| 7,767,908 B2 | 8/2010 | Sylvan | |
| 7,975,312 B2 * | 7/2011 | Broderson | G06F 21/10 380/203 |
| 8,177,573 B2 * | 5/2012 | Deno | H01R 13/5205 439/274 |
| 8,410,360 B2 * | 4/2013 | Nishimura | H02G 3/22 174/50.5 |
| 8,575,499 B2 * | 11/2013 | Hayashi | H05K 1/118 174/539 |
| 8,633,409 B2 * | 1/2014 | Sawayanagi | B60Q 3/30 174/564 |
| 8,936,248 B2 * | 1/2015 | Mitsui | F02B 75/041 277/634 |
| 9,268,102 B2 * | 2/2016 | Daems | G02B 6/3809 |
| 9,450,327 B1 * | 9/2016 | Madinabeitia | H02G 3/083 |
| 9,515,472 B2 * | 12/2016 | Muehlmichel | H02G 15/013 |
| 2003/0027454 A1 * | 2/2003 | Sugiyama | H01R 13/5208 439/588 |
| 2006/0014412 A1 * | 1/2006 | Lutsch | H01R 4/20 439/275 |
| 2013/0277920 A1 * | 10/2013 | Kobayashi | H01R 13/5205 277/626 |

* cited by examiner

DEVICE AND METHOD FOR PROTECTING A CONNECTOR ASSEMBLY

TECHNICAL FIELD

The present application relates generally to the field of connectors. In particular, the embodiments of the present invention relate to a device and method for protecting a connector assembly from ingress of foreign substances (objects and other material).

BACKGROUND

A connector assembly may sometimes include wires configured for transmission of signals, transmission of electric power, or other purposes. The respective wires may vary in length spanning distances up to several meters, throughout a vehicle (e.g., an automobile, aircraft, spacecraft, ship, etc.), or other distances. In some applications, the respective wires may be exposed to adverse conditions that may compromise the integrity, performance, etc. of the wire. Accordingly, a connector assembly may include seals used to reduce or eliminate penetration by foreign substances, prevent degradation of wire integrity or electrical contact, reduce human contact, etc. Therefore, an ongoing need exists for improved designs that allow for such connector assemblies to be protected from adverse conditions.

SUMMARY OF THE INVENTION

In an example embodiment, the connector kit comprises a housing, a wire-mounted component, and a seal. The seal is configured to be coupled to the housing and the wire-mounted component. The seal comprises a single unitary body, and the seal is structured to provide a seal for the wire-mounted component and a wire to protect an interior of the connector from penetration by foreign substances.

In another example embodiment, a method comprises various steps respectively performed by a wire-mounted component, a seal, and a housing of a connector assembly. Specifically, the method comprises receiving a wire by the wire-mounted component. The method further comprising surrounding, by a seal, at least a portion of the wire and the wire-mounted component. The method further comprises receiving the seal by a housing. The seal comprises a single unitary body structured to seal the wire-mounted component and the wire and to protect an interior of a connector assembly from penetration by foreign substances. The connector assembly comprises the wire-mounted component, the seal and the housing.

These and other features of the implementations described herein, together with the organization and manner of operation thereof, will become apparent from the following detailed description when taken in conjunction with the accompanying drawings, wherein like elements have like numerals throughout the several drawings described below.

BRIEF DESCRIPTION OF THE DRAWINGS

The details of one or more implementations are set forth in the accompanying drawings and the description below. Other features, aspects, and advantages of the disclosure will become apparent from the description, the drawings, and the claims, in which:

Figure 1A:
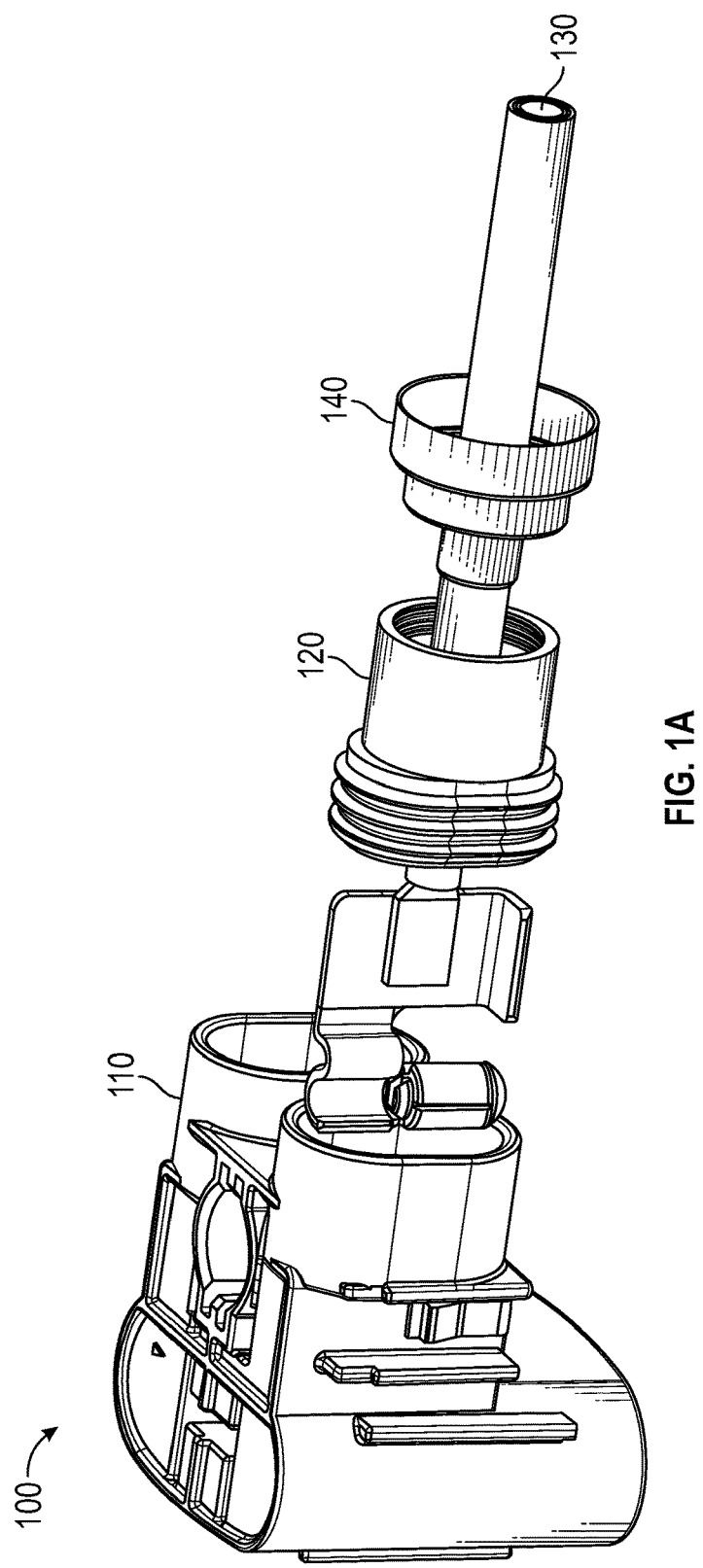
FIG. 1a illustrates a connector assembly according to an example embodiment.

It will be recognized that some or all of the figures are schematic representations for purposes of illustration. The figures are provided for the purpose of illustrating one or more implementations with the explicit understanding that they will not be used to limit the scope or the meaning of the claims.

DETAILED DESCRIPTION

Referring to the figures generally, a connector assembly ("connector") having a seal that protects against water, contaminants and other foreign substances is described. In some embodiments, the seal may include a sealing surface for a connector housing, a sealing surface for a wire, and a sealing surface for a wire mounted-component. Because the same seal provides sealing at such various locations, construction of the connector assembly is simplified (e.g., fewer pieces to assemble, fewer assembly steps, etc.).

An example of such an arrangement is shown in FIGS. 1a-3. Referring first to FIGS. 1a-1d, FIGS. 1a-1d depicts a connector 100 including a housing 110, a seal 120, and a wire-mounted component 140, according to one embodiment. The seal 120 and the wire-mounted component 140 comprise holes through which a wire 130 may be inserted (e.g., an insulated multi-strand metal wire suitable for carrying electric power, electronic signals, etc.). The housing 110 includes a hole that is configured to receive the seal 120. During assembly, the wire-mounted component 140 is pushed over the wire 130. The seal 120 is then pushed along the Y-axis over the wire-mounted component 140 (the Y-axis being defined by the longitudinal axis of the wire 130). The wire 130, the wire mounted component 140, and the seal 120 are then inserted into the housing 110. The connector 100 may further include a rigid metal female or male conductive electrical terminal that is attached to the wire 130. The connector 100 as shown in FIGS. 1a-1d is configured to be a two pin connector, and hence the housing 110 includes a second hole configured to receive a second arrangement (seal, wire, wire-mounted component) as described above. In a mated configuration, the connector 100 may mate with a second connector (not shown). In such a mated configuration, the second connector would then be located to the left of the connector 100 shown in FIGS. 1a-1d.

The housing 110 may be made of a rigid material such as an injection molded non-conductive plastic or composite material. For example, the housing 110 may comprise an injection molded non-conductive plastic material. In other embodiments, the housing 110 may be made from any suitable material and/or combinations of materials. The housing may be configured to accommodate the various components, assemblies, devices, etc. For example, in some embodiments, the connector 100 may include other structures such as a terminal position assurance device, connector position assurance device, other circuits, or any other suitable device.

The wire-mounted component 140 may also be made of a rigid material such as an injection molded non-conductive plastic or composite material, a conductive metal material, etc. In other embodiments, the housing 110 may be made from any suitable material and/or combinations of materials. In one configuration, the wire-mounted component 140 forms a shield terminal. The wire-mounted component 140 may be structured to provide strain relief. The wire-mounted component 140 and the seal 120 may be structured to provide a rigid body for a human to grasp without grasping the wire 130 directly. Hence, the wire-mounted component 140 and the seal 120 extend the life of and/or the reliability of the wire 130 by protecting the integrity of the wire 130 from mechanical stresses such as kinking, twisting, strain, crushing, etc. In another configuration, the wire-mounted component may terminate a layer of electro-magnetic shielding on the wire 130.

Figure 1B:
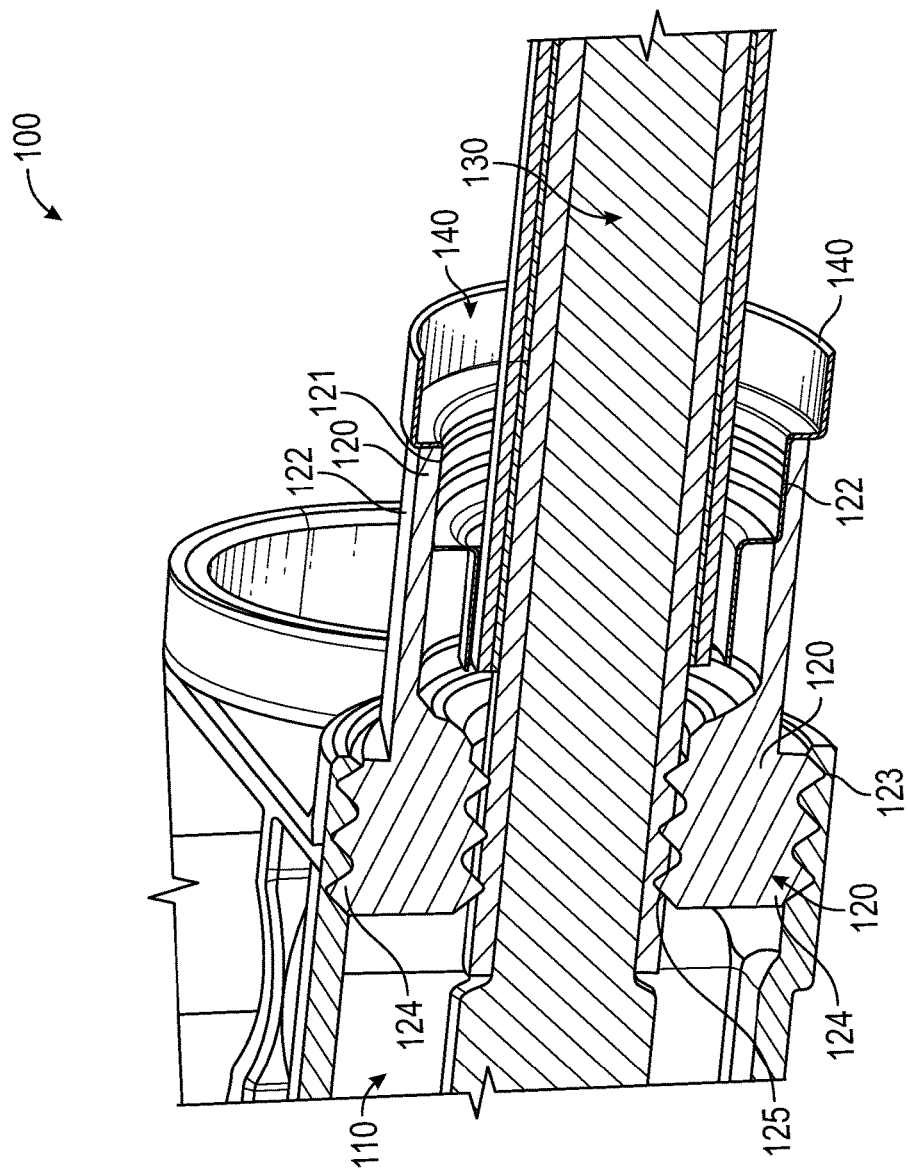
FIG. 1b illustrates an interior view of a connector assembly according to an example embodiment.
Figure 1C:
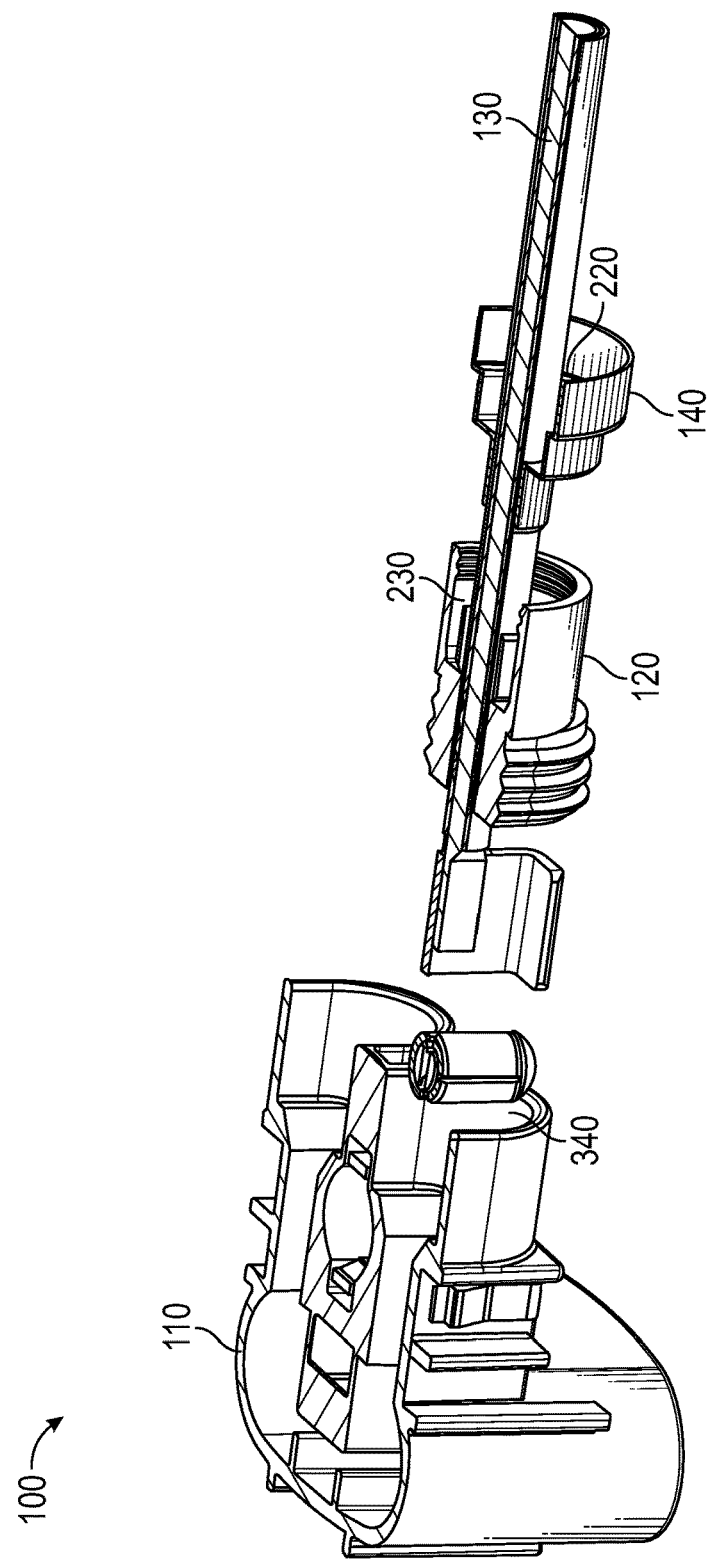
FIG. 1c illustrates an interior view of a connector assembly according to an example embodiment.
Figure 1D:
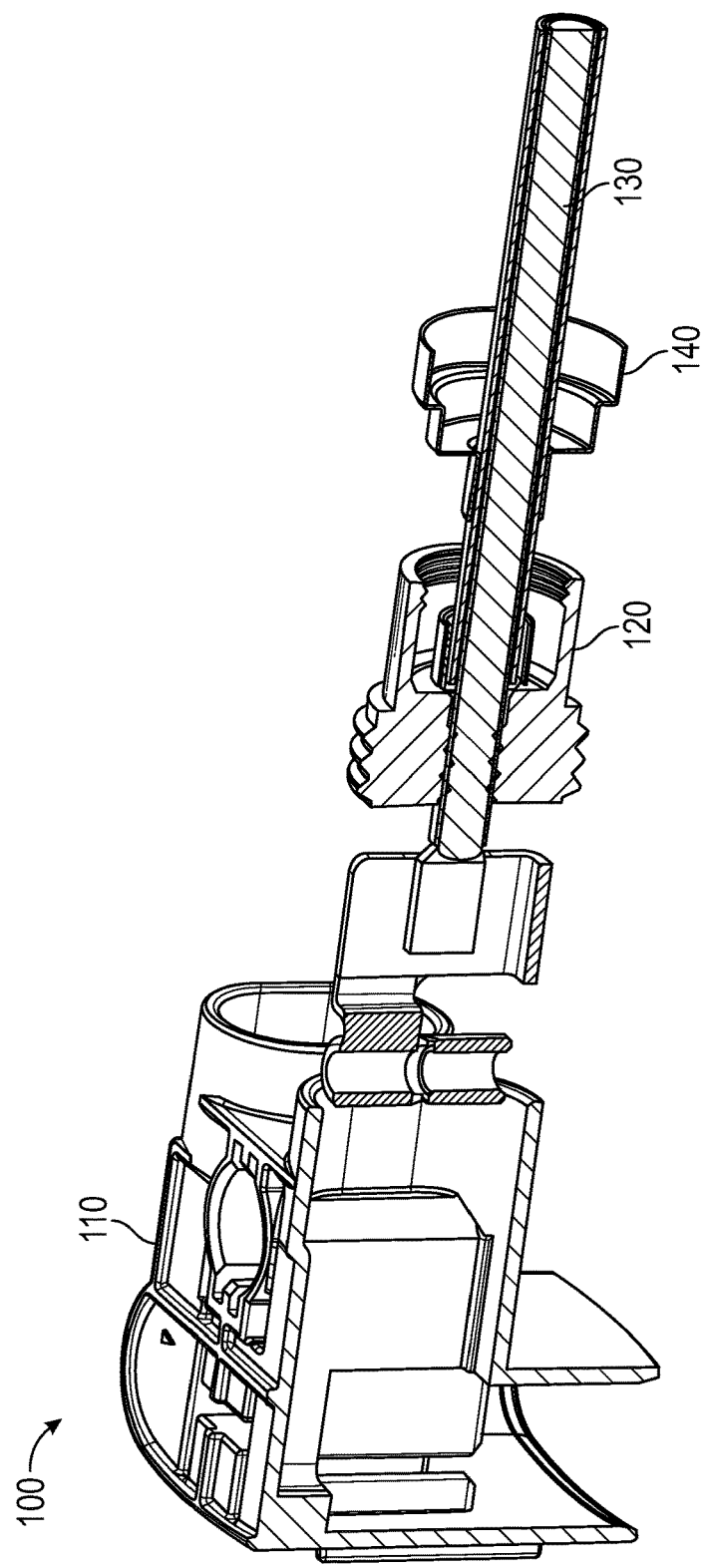
FIG. 1d illustrates an interior view of a connector assembly according to an example embodiment.

The wire-mounted component 140 may be structured in a generally cylindrical tubular form such that the wire 130 may be inserted through the wire-mounted component 140 (as shown in FIGS. 1c and 1d) and may extend through the wire-mounted component 140 after the connector 100 is assembled. In other embodiments, the wire mounted component may have a different cross sectional profile, such as a square, a rectangle, or an irregular shape. The wire-mounted component 140 may be coupled to the wire 130, e.g., via a friction fit or by a physical fastening process (e.g. crimping, heat-staking, etc.). For example, the wire-mounted component 140 may be mounted on the wire 130 such that a surface of the wire 130 engages with a surface of the wire-mounted component 140.

The seal 120 may for example be made of an elastomeric material. In other embodiments, the housing 110 may be made from any suitable material and/or combinations of materials. The seal 120 may be structured to protect against or resist foreign substances penetrating the interior of the connector 100 (e.g., in FIGS. 1a-1d, moving from right to left, to the region where mating of the male and female terminals occurs). Such foreign substances may include fluids (e.g., water, fuel, oil, coolant, etc), solids (e.g., dust and other particles), and gases (e.g., in the case of a vacuum sealed arrangement). Again, the seal 120 may be structured in a generally tubular form such that the seal 130 may fit over the wire mounted component 140 and such that the wire 130 may be inserted through the seal 120 and may extend through the seal 120 after the connector 100 is assembled.

As depicted for example in FIG. 1b, the seal may have a first end 122 and a second end 124. The first end 122 of the seal 120 has an inner surface 121, and the second end 124 has an outer surface 123 and an inner surface 125, discussed in greater detail below. In the assembled state, the first end of the seal 120 circumscribes the wire-mounted component 140, and the connector housing 110 circumscribes the second end 124 of the seal 120. The seal 120 may be formed of a single unitary body, i.e., such that the first end 122 and the second end 124 (including the surfaces 121, 123, and 125) are all formed of a single piece of thermoplastic or elastomeric material.

The seal 120 may be coupled to the wire mounted component 140, e.g., via a friction fit. The seal 120 may form a boot such that the boot stretches around the wire-mounted component 140. For example, the seal 120 may be mounted on the wire-mounted component 140 such that the surface 121 of the seal 120 engages with an outer surface of the wire-mounted component 140. When the seal 120 is pushed over the wire-mounted component 140, the elastomeric material of which the seal is formed may expand (e.g., expand slightly) in order to accommodate the wire-mounted component 140. In the assembled state of the connector 100, the first end 122 of the seal 120 may be in a state of tension, such that the seal 120 applies a radially inward force against the wire mounted component 140. The increased tension may therefore serve to increase friction between the seal 120 and the wire-mounted component 140, thereby providing for a tighter friction fit (e.g., as compared to zero tension). Given the friction fit provided by the elastomeric material, the surface 121 provides a sealing surface for the wire-mounted component 140.

The seal 120 may be structured to surround at least a portion of the wire-mounted component 140 to protect the wire-mounted component 140 (e.g., encompassing circumferentially, but terminating along the Y-axis). For example, the seal 120 may surround a portion of the wire-mounted component 140 such that a portion of the wire-mounted component 140 may extend or otherwise be exposed outside of the seal 120.

The seal 120 may be coupled to the housing 110 and the wire 130, e.g., via a friction fit. For example, the seal 120 may be mounted on the wire 130 such that the inner surface 125 of the seal 120 engages with an outer surface of the wire 130, and further the seal 120 may be mounted to the housing 110 such that the outer surface 125 of the seal 120 engages with an inner surface of the housing 110. When the seal 120 is pushed into the housing 110, the elastomeric material of which the seal is formed may be forced to compress slightly in order to fit into the housing 110. In the assembled state of the connector 100, the second end 124 of the seal 120 may be in a state of compression, such that the seal 120 applies a radially inward force against the wire 130, and a radially outward force against the housing 110. The increased force may therefore serve to increase friction between the seal 120 and the wire 130, and between the seal 120 and the housing 110, thereby providing for a tighter friction fit.

Given the friction fit provided by the elastomeric material, the surface 123 provides a sealing surface for the housing 110 and the surface 125 provides a sealing surface for the wire 130. The sealing surface 123 and the sealing surface 125 are at least partially coextensive in the axial direction of the wire 130, whereas the sealing surface 121 for the wire-mounted component 140 is displaced in the axial direction from the sealing surfaces 123 and 125. Hence, in the arrangement of FIGS. 1a-1d, there are three sealing surfaces, two of which are at one end of the seal 120, and the remaining one of which is at the other end of the seal 120.

The connector 100 may be used in various types of applications. As one example, the connector 100 may be used in vehicular applications (e.g., automotive, trucking, boating, etc.). The connector 100 may be used in any application where a seal is needed. The operating temperature of the connector 100 may range from a calibratable floor to a calibratable ceiling. For example, the operating temperature may range from −40° C. to 145° C. In some examples, the retention force (N) of a connector to another connector may be, for example, at least 75N. In some examples, the connector assembly may have a terminal-to-connector retention force of at least 75N or 90N and a connector-to-connector retention force of at least 110N. In other embodiments, the connector assembly 100 may be used to establish fluid connections with various types of components (e.g., for the transmission of a liquid or gas).

Figure 2:
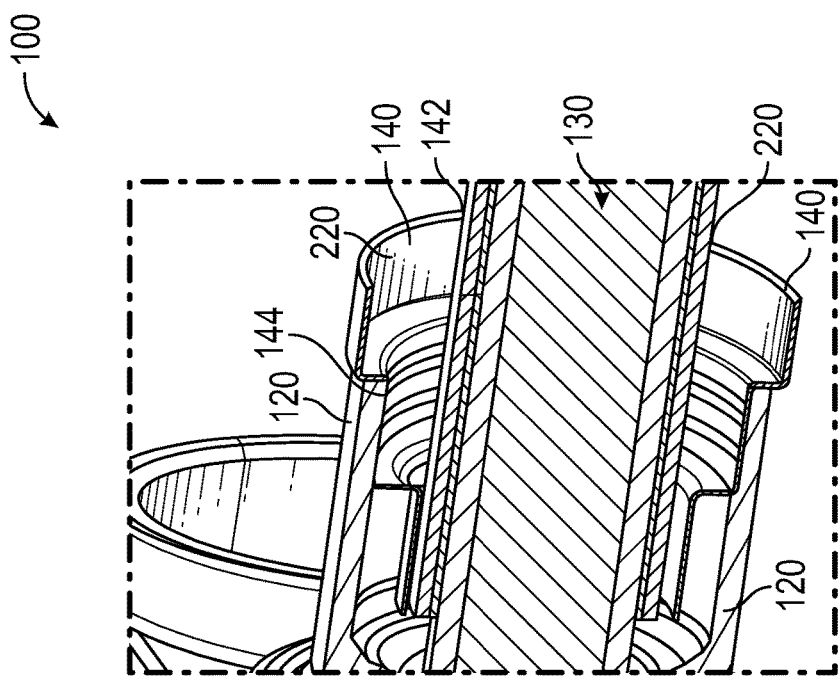
FIG. 2 illustrates an exploded interior view of a connector assembly according to an example embodiment.

With reference to FIG. 2, an exploded interior view of a connector 100 is illustrated according to an example embodiment. The wire-mounted component 140 comprises an inner surface 142 and an outer surface 144. The inner surface 142 is disposed between the wire 130 and the wire-mounted component 140, while the outer surface 144 is disposed between the wire-mounted component 140 and the seal 120. As shown, the wire-mounted component 140 is structured to define a first cavity 220. The first cavity 220 is structured to receive the wire 130.

Figure 3:
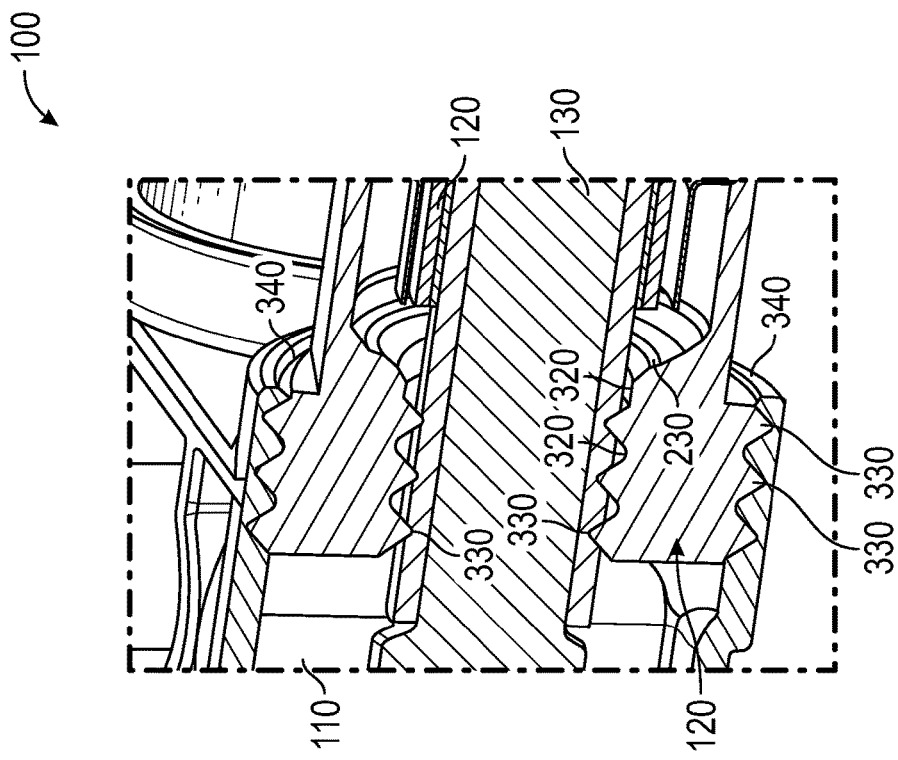
FIG. 3 illustrates an exploded interior view of a connector assembly according to an example embodiment.

FIG. 3 illustrates an exploded interior view of the connector 100 according to an example embodiment. As illustrated, the housing 110 is structured to define a second cavity 340. The second cavity 340 is structured to receive or otherwise hold the seal 120, the wire 130, the wire-mounted component 140, or a combination thereof. As depicted, in some embodiments, the seal 120 comprises a plurality of protrusions 330. The plurality of protrusions 330 are structured to engage the housing 110 and the wire 130 to seal the interior of the connector 110 (e.g., to prevent ingress of liquids or solids). Accordingly, the plurality of protrusions 330 may prevent contamination, fluids, and other foreign substances from traveling through the connector 100 into the interior of the housing 110.

Although three protrusions 330 are depicted, more (e.g., greater than three protrusions) or less protrusions (e.g., less than three protrusions) may be utilized to waterproof the connector 100. For example, as more protrusions 330 are utilized, the greater the degree of protection of the connector 100 from an adverse application (e.g., the greater the degree of water protection). The degree of protection may be characterized, for example, by references to the International Protection Code (e.g., IEC standard 60529, ISO 20653, or any other standard) which rates the degree of protection against water, particles, dust, or other adverse applications. For example, the degree of protection may include a rating level zero (no protection), level one (effective against dripping water), level two (effective against vertical dripping water), level three (effective against water falling as a spray at angles up to 60°), level four (effective against water splashing against an enclosure from any direction), level five (effective against water projected by a nozzle (e.g., 6.3 mm) against an enclosure from any direction), level six (effective against water projected in powerful jets (e.g., 12.5 mm nozzle) against an enclosure), level 6K (effective against water projected in powerful jets (e.g., 6.3 mm nozzle) against an enclosure), level seven (effective against an ingress of water in harmful quantity when the enclosure is immersed in water under defined conditions of pressure and time (up to 1 m of submersion)), level eight (effective against continuous immersion in water under conditions specified by the manufacturer), and level nine (effective against close-range high pressure, high temperature spray downs).

The plurality of protrusions 330 may further secure the position of the wire 130 within the connector 100. For example, the plurality of protrusions 330 may provide a snug fit between the seal 120 and the housing 110. In further embodiments, the plurality of protrusions 330 are structured to secure the position of the wire 130 within the seal 120. For example, the plurality of protrusions 330 may prevent the wire 130 from moving within or otherwise about the housing 110. In other examples, the plurality of protrusions 330 may prevent the wire 130 from moving within or otherwise about the seal 120.

In some embodiments, the interior surface of the housing 110 is smooth and the protrusions compress when the seal 130 is inserted into the housing 110. In other embodiments, the interior of the housing 110 has matching protrusions that engage the protrusions 330 when the seal is inserted in the housing 110. The plurality of protrusions 330 may be structured to extend from the seal 120. To that end, the plurality of protrusions 330 may prevent the seal 120 from sliding out of or otherwise becoming disengaged from the housing 110, the wire 130, the wire-mounted component 140, or a combination thereof. In some embodiments, the exterior surface of the wire 130 is smooth and protrusions 320 compress when the seal 130 is inserted into the housing 110. In other embodiments, ridges are formed in the wire 130 that engage the protrusions 320 when the seal is inserted in the housing 110. In some embodiments, the plurality of protrusions 320 and 330 may comprise any suitable plurality of diameters, lengths, and widths. For example, one or more of the plurality of protrusions may range in size or diameter. In some examples, the plurality of protrusions may comprise the same or different size with respect to each of the plurality of protrusions.

Figure 4:
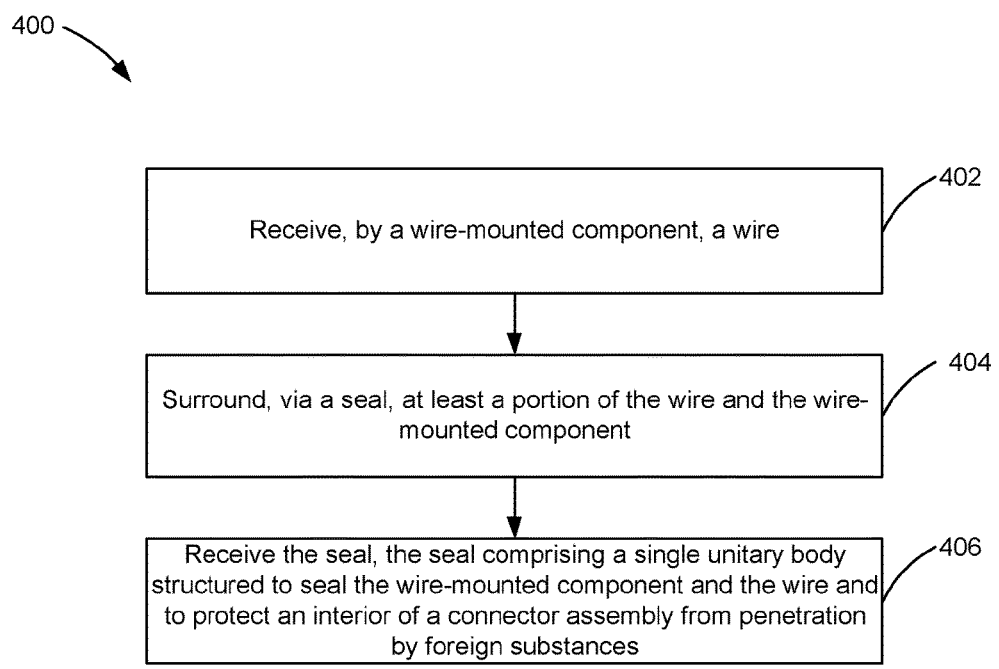
FIG. 4 illustrates a flowchart of a method of protecting a connector assembly according to one embodiment.

FIG. 4 is a flowchart illustrating a process for protecting a connector 100 according to an embodiment of the invention. The process for protecting a connector 100 comprises the step of receiving, by a wire-mounted component 140, a wire (e.g., the wire 130) at 402. The wire 130, as described herein, may comprise a strand or portion of metal. The wire 130 may be structured to engage in an electrical contact. For example, the wire 130 may be structured to transmit a signal. Alternatively or additionally, the wire 130 may be structured to support a mechanical load. The wire 130 may be made of any suitable material such as, but not limited to, copper, steel, or brass. The wire-mounted component 140, as described herein, may comprise a tubular form such that the wire-mounted component 140 surrounds at least a portion of the wire 130. The wire 130 may be received by the wire-mounted component 140 via a first cavity (e.g., the first cavity 220) defined by the wire-mounted component 140. The wire 130 may, in some examples, extend through the wire-mounted component 140.

The process for protecting a connector 100 includes the step of surrounding, by a seal (e.g., the seal 120), at least a portion of the wire 130 and the wire-mounted component 140 at 404. The seal 120 is structured to protect an interior of the connector assembly from penetration by foreign substances (e.g. an application of moisture, pressure, strain, or a combination thereof). The seal 120 may be structured to define a second cavity (e.g., the second cavity 230). In turn, the second cavity 230 may receive the wire 130. The wire 130 may extend through the seal 120 and/or the second cavity 230. The wire 130 may, in some examples, extend through one end of the seal 120. Alternatively or additionally, the wire 130 may extend through multiple ends of the seal 120.

After surrounding at least a portion of the wire 130 and the wire-mounted component 140 with the seal 120, the process for protecting a connector 100 comprises the step of receiving the seal 120 into, or otherwise by, a housing (e.g. the housing 110) of a connector 100 at 406. In some examples, the seal 120 may be received into a portion of the housing 110. Although one seal 120 is depicted in FIGS. 1a-3, the housing 110 may include a plurality of seals 120. The plurality of seals 120 may be disposed within various portions, areas, or parts of the housing 110.

Following these steps, any additional steps known in the art may be used to assemble a connector. Such steps may include other additional steps depending upon the design and desired attributes of the connector.

While this specification contains many specific embodiment details, these should not be construed as limitations on the scope of what may be claimed, but rather as descriptions of features specific to particular embodiments. Certain features described in this specification in the context of separate embodiments can also be implemented in combination in a single embodiment. Conversely, various features described in the context of a single embodiment can also be implemented in multiple embodiments separately or in any suitable subcombination. Moreover, although features may be described above as acting in certain combinations and even initially claimed as such, one or more features from a claimed combination can in some cases be excised from the combination, and the claimed combination may be directed to a sub combination or variation of a subcombination.

As utilized herein, the terms "coupled," "connected," and the like as used herein mean the joining of two components directly or indirectly to one another. Such joining may be stationary (e.g., permanent) or moveable (e.g., removable or releasable). Such joining may be achieved with the two components or the two components and any additional intermediate components being integrally formed as a single unitary body with one another or with the two components or the two components and any additional intermediate components being attached to one another.

It is important to note that the construction and arrangement of the system shown in the various exemplary embodiments is illustrative only and not restrictive in character. All changes and modifications that come within the spirit and/or scope of the described embodiments are desired to be protected. It should be understood that some features may not be necessary and embodiments lacking the various features may be contemplated as within the scope of the application, the scope being defined by the claims that follow. When the language "at least a portion" and/or "a portion" is used the item can include a portion and/or the entire item unless specifically stated to the contrary.

The foregoing description of embodiments has been presented for purposes of illustration and description. It is not intended to be exhaustive or to limit the disclosure to the precise form disclosed, and modifications and variations are possible in light of the above teachings or may be acquired from this disclosure. The embodiments were chosen and described in order to explain the principals of the disclosure and its practical application to enable one skilled in the art to utilize the various embodiments and with various modifications as are suited to the particular use contemplated. Other substitutions, modifications, changes and omissions may be made in the design, operating conditions and arrangement of the embodiments without departing from the scope of the present disclosure as expressed in the appended claims.

What is claimed is:

1. A connector kit comprising:
a housing;
a wire-mounted component; and
a seal configured to be attached to the wire-mounted component to define a boot assembly;
wherein the boot assembly, when mounted on a wire, defines:
a first sealing surface located at a first location along a longitudinal axis about which the boot assembly is centered, the first sealing surface defined between an outer surface of the wire and an inner surface of the seal;
a second sealing surface located at a second location along the longitudinal axis, the second sealing surface defined between an outer surface of the wire-mounted component and the inner surface of the seal; and
a third sealing surface located at a third location along the longitudinal axis, the third sealing surface defined between the outer surface of the wire and an inner surface of the wire-mounted component, the third location being located in between the first location and the second location with respect to the longitudinal axis.

2. The connector protection assembly of claim 1, wherein the seal comprises an elastomeric material, and wherein the seal is configured to expand to engage the wire-mounted component via a friction fit to define the second sealing surface.

3. The connector protection assembly of claim 1, wherein the seal is configured to be coupled via a friction fit to the housing and the wire.

4. The connector protection assembly of claim 1, wherein the seal is configured to be mounted to the housing such that the outer surface of the seal engages with an inner surface of the housing.

5. The connector protection assembly of claim 1, wherein a plurality of protrusions are provided along at least one of the inner surface of the seal or the outer surface of the seal, and wherein the plurality of protrusions are structured to engage the housing, the wire, or a combination thereof.

6. The connector protection assembly of claim 1, wherein the seal is structured to surround at least a portion of the wire.

7. The connector kit of claim 1, wherein at least a portion of the outer surface of the wire-mounted component that defines the second sealing arrangement is defined by a substantially uninterrupted wall structure extending substantially circumferentially about the longitudinal axis.

8. The connector kit of claim 1, wherein a cavity is defined between first sealing arrangement, the second sealing arrangement, and at least a portion of the inner surface of the seal.

9. The connector kit of claim 8, wherein the cavity is fluidly sealed relative to the ambient environment.

10. The connector kit of claim 1, wherein when the boot assembly is mounted to the housing, a fourth sealing arrangement is defined by an inner surface of the housing and the outer surface of the seal.

11. The connector protection assembly of claim 10, wherein the first sealing surface and the fourth sealing surface are at least partially coextensive along the longitudinal axis.

12. The connector protection assembly of claim 11, wherein the fourth sealing surface is displaced along the longitudinal axis from the third sealing surface and the second sealing surface.

13. A method comprising:
receiving, by a wire-mounted component, a wire;
surrounding, by a seal, at least a portion of the wire and the wire-mounted component to define an integral boot assembly mounted about the wire; and
receiving, by a housing, the seal:
wherein the boot assembly, when mounted about the wire, defines:
a first sealing surface located at a first location along a longitudinal axis about which the boot assembly is centered, the first sealing surface defined between an outer surface of the wire and an inner surface of the seal;
a second sealing surface located at a second location along the longitudinal axis, the second sealing surface defined between an outer surface of the wire-mounted component and the inner surface of the seal; and a third sealing surface located at a third location along the longitudinal axis, the third sealing surface defined between the outer surface of the wire and an inner surface of the wire-mounted component, the third location being located in between the first location and the second location with respect to the longitudinal axis.

14. The method of claim 13, wherein the wire is structured for electrical contact.

15. The method of claim 13, wherein the seal is formed of a single piece of thermoplastic material, elastomeric material, or a combination thereof.

16. The method of claim 13, wherein the seal is mounted to the housing such that the outer surface of the seal engages with an inner surface of the housing.

17. The method of claim 13, wherein at least a portion of the outer surface of the wire-mounted component that defines the second sealing arrangement is defined by an uninterrupted wall structure extending circumferentially about the longitudinal axis.

18. The method of claim 13, wherein a cavity is defined between first sealing arrangement, the second sealing arrangement, and at least a portion of the inner surface of the seal.

19. The method of claim 18, wherein the cavity is fluidly sealed relative to the ambient environment.

20. A connector kit comprising:
a housing having a cavity formed therein;
a wire-mounted component having a substantially uninterrupted external surface extending circumferentially about a longitudinal axis about which the wire-mounted component is centered; and
a seal configured to be coupled to the housing and the wire-mounted component, the seal being formed of a single elastomeric unitary body, wherein the seal comprises:
a first end, the first end having a first inner surface that provides a first sealing surface for the wire-mounted component; and
a second end, the second end having a second inner surface that provides a second sealing surface for the wire, and the second end having a first outer surface that provides a third sealing surface for the housing;
wherein the first end of the seal is configured to be pushed over the wire-mounted component to receive the wire-mounted component therein;
wherein, when the seal is pushed over the wire-mounted component, the seal expands to accommodate the wire-mounted component and is placed into a state of tension, the state of tension causing the first sealing surface defined by the first inner surface of the seal to exert a radially inward force against the circumferentially extending external surface of the wire-mounted component to create a friction fit between the seal and the wire-mounted component;
wherein the cavity in the housing is configured to receive the second end of the seal;
wherein, when the second end of the seal is received in the housing, the seal is placed into a state of compression, the state of compression causing the seal to exert a radially outward force against the housing to create a friction fit between the seal and the housing, and the state of compression causing the seal to exert a radially inward force against a wire about which the seal is mounted to create a friction fit between the seal and the wire.

* * * * *